United States Patent
Yasunobe

(10) Patent No.: US 10,535,548 B2
(45) Date of Patent: Jan. 14, 2020

(54) SUBSTRATE HOLDING APPARATUS AND SUBSTRATE PROCESSING APPARATUS

(71) Applicant: CANON KABUSHIKI KAISHA, Tokyo (JP)

(72) Inventor: Osamu Yasunobe, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/351,890

(22) Filed: Mar. 13, 2019

(65) Prior Publication Data
US 2019/0287842 A1 Sep. 19, 2019

(30) Foreign Application Priority Data
Mar. 19, 2018 (JP) ................. 2018-051520

(51) Int. Cl.
*H01L 21/683* (2006.01)
*G03F 7/20* (2006.01)
*H01L 21/67* (2006.01)

(52) U.S. Cl.
CPC .......... *H01L 21/6838* (2013.01); *G03F 7/707* (2013.01); *H01L 21/67017* (2013.01)

(58) Field of Classification Search
CPC . G03F 7/707; G03F 7/70725; H01L 21/67051
USPC .......................................................... 355/72
See application file for complete search history.

(56) References Cited

U.S. PATENT DOCUMENTS

| | | | | |
|---|---|---|---|---|
| 7,019,820 B2* | 3/2006 | Ottens | ..................... | G03F 7/707 355/72 |
| 7,187,433 B2* | 3/2007 | Ottens | ..................... | G03F 7/707 355/53 |
| 7,889,323 B2* | 2/2011 | Sung | ....................... | G03F 7/707 355/72 |
| 2006/0102289 A1* | 5/2006 | Fukatsu | ........... | H01L 21/67051 156/345.55 |
| 2015/0027503 A1* | 1/2015 | Takiguchi | ......... | H01L 21/67051 134/95.2 |

FOREIGN PATENT DOCUMENTS

JP H08172047 A 7/1996
JP 4933948 B2 5/2012

* cited by examiner

*Primary Examiner* — Hung Nguyen
(74) *Attorney, Agent, or Firm* — Rossi, Kimms & McDowell LLP

(57) ABSTRACT

A substrate holding apparatus that holds a substrate is provided. The apparatus comprises a rotary shaft which rotates about a vertical axis and includes a suction path leading from an upper end of the rotary shaft, and a holding unit which includes a suction hole formed in a rotation center, is fixed at the upper end of the rotary shaft such that the suction hole communicates with the suction path, and holds the substrate by sucking the substrate, wherein a plurality of vent holes for introducing an external gas into a space between the holding unit and the substrate are formed at positions rotationally symmetric with respect to the rotation center of the holding unit with an angle to face a back surface of the substrate placed on the holding unit.

9 Claims, 5 Drawing Sheets

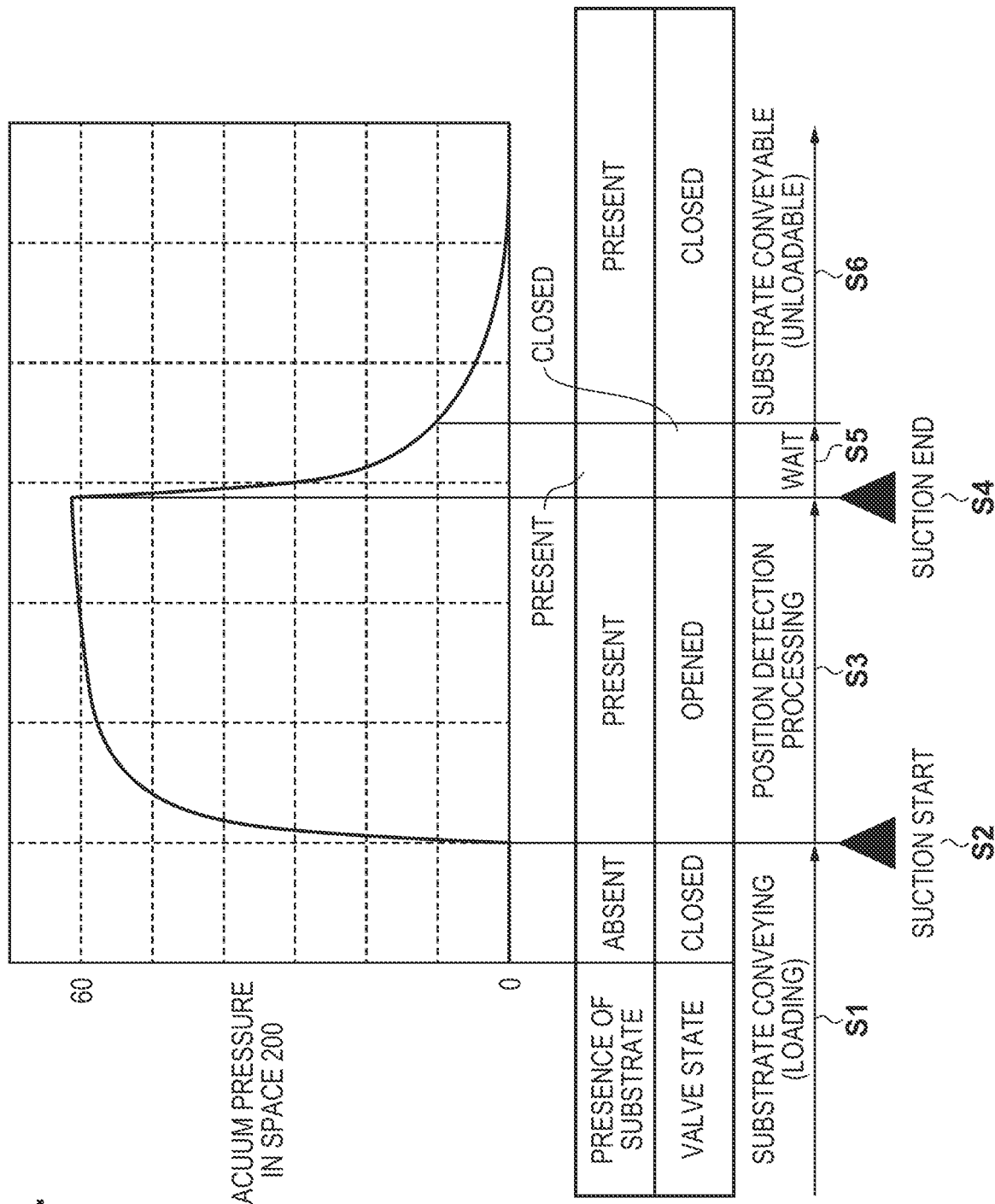

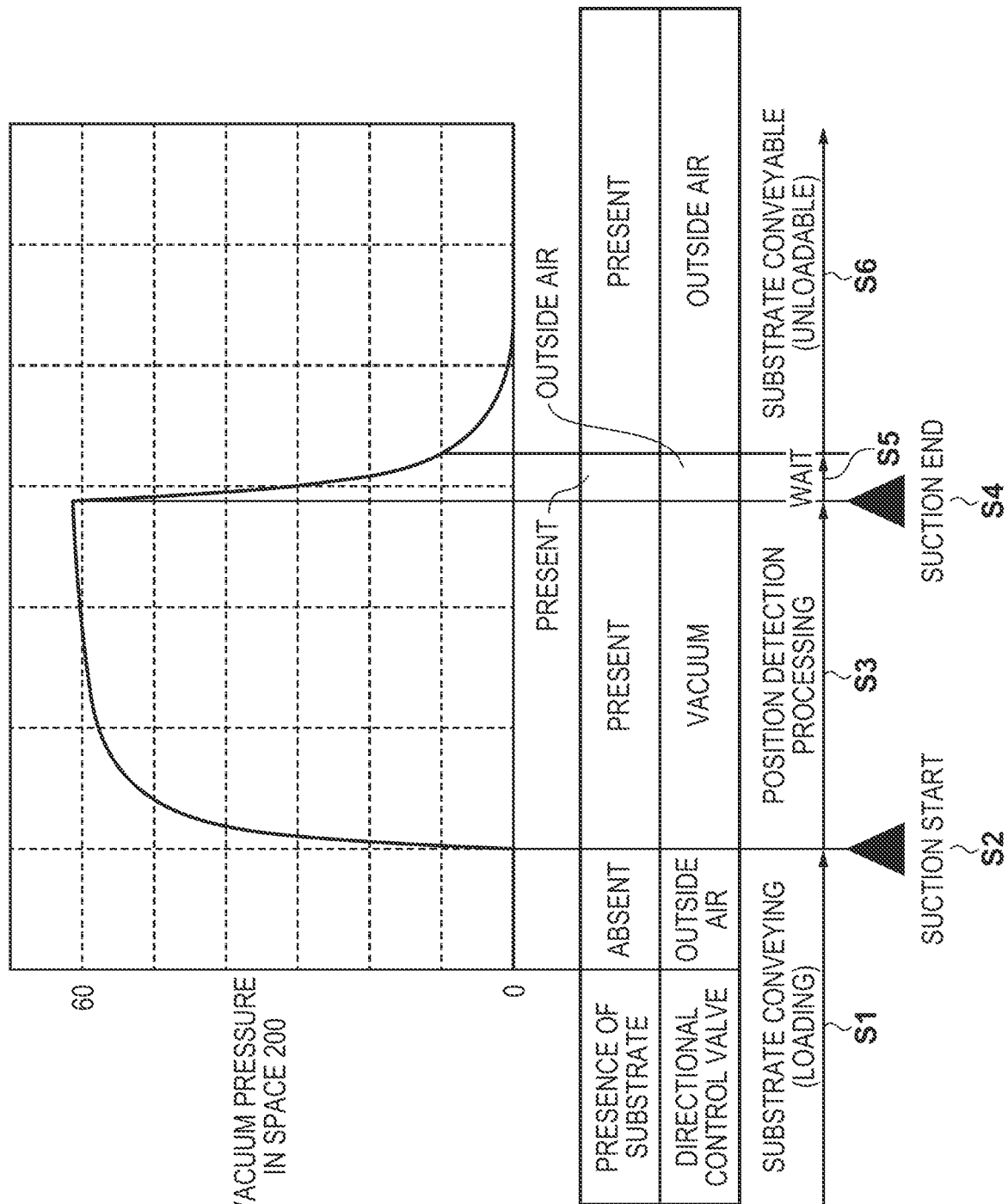

SUBSTRATE HOLDING APPARATUS AND SUBSTRATE PROCESSING APPARATUS

BACKGROUND OF THE INVENTION

Field of the Invention

The present invention relates to a substrate holding apparatus and a substrate processing apparatus.

Description of the Related Art

A substrate holding apparatus for supporting and rotating a substrate to be processed such as a semiconductor wafer and positioning the substrate by obtaining the eccentric component of rotation of the substrate is used in a preprocess and the like of a lithography process. In a semiconductor manufacturing process, along with miniaturization of patterns due to high integration of integrated circuits, more strict control of dust is required.

Japanese Patent Laid-Open No. 08-172047 discloses an arrangement in which a filter for catching dust is provided in a ventilation unit of a substrate rotation processing apparatus. Japanese Patent No. 4933948 discloses an arrangement in which an exhaust port used for suction and an air supply port used for releasing a substrate are provided as vent holes in a substrate suction unit.

Conventionally, a substrate holding mechanism in a semiconductor manufacturing process generally holds a substrate by vacuum suction. A substrate holding mechanism using vacuum suction includes, for example, at least one ventilation line system, and realizes holding and releasing of a substrate by switching between a connection with a vacuum source and a connection with, for example, positive pressure atmospheric air or an air supply source. In this method, dust adhered to the back surface of the substrate and dust generated at the moment when the substrate is held can be sucked into the ventilation line and accumulated. On the other hand, when releasing the substrate, since the middle part of the ventilation line is connected to atmospheric air or the air supply source by a selector valve, a gas flows back to the substrate through the ventilation line. Accordingly, the accumulated dust can be ejected.

In Japanese Patent Laid-Open No. 08-172047, a dust collector filter is provided in the middle of a vacuum line, but it cannot prevent backflow of dust accumulated in the filter when a gas flows backward. In Japanese Patent No. 4933948, a vacuum ventilation line for vacuum-sucking a substrate and an air supply line for breaking a vacuum are provided in a wafer chucking mechanism. However, as the air supply is interrupted on the air supply line side, dust may be generated on the air supply line side.

SUMMARY OF THE INVENTION

The present invention provides, for example, a substrate holding apparatus advantageous in suppressing intrusion of dust.

The present invention in its one aspect provides a substrate holding apparatus that holds a substrate, comprising a rotary shaft which rotates about a vertical axis and includes a suction path leading from an upper end of the rotary shaft, and a holding unit which includes a suction hole formed in a rotation center, is fixed at the upper end of the rotary shaft such that the suction hole communicates with the suction path, and holds the substrate by sucking the substrate, wherein a plurality of vent holes for introducing an external gas into a space between the holding unit and the substrate are formed at positions rotationally symmetric with respect to the rotation center of the holding unit with an angle to face a back surface of the substrate placed on the holding unit.

Further features of the present invention will become apparent from the following description of exemplary embodiments (with reference to the attached drawings).

BRIEF DESCRIPTION OF THE DRAWINGS

FIG. 4 is a diagram for explaining a substrate holding process upon processing a substrate; and FIG. 5 is a diagram for explaining a substrate holding process upon processing a substrate.

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are merely specific examples of the embodiments of the present invention, and do not limit the present invention. In addition, not all combinations of characteristic features described in the following embodiments are essential to the solution of the problem in the present invention.

Figure 1:
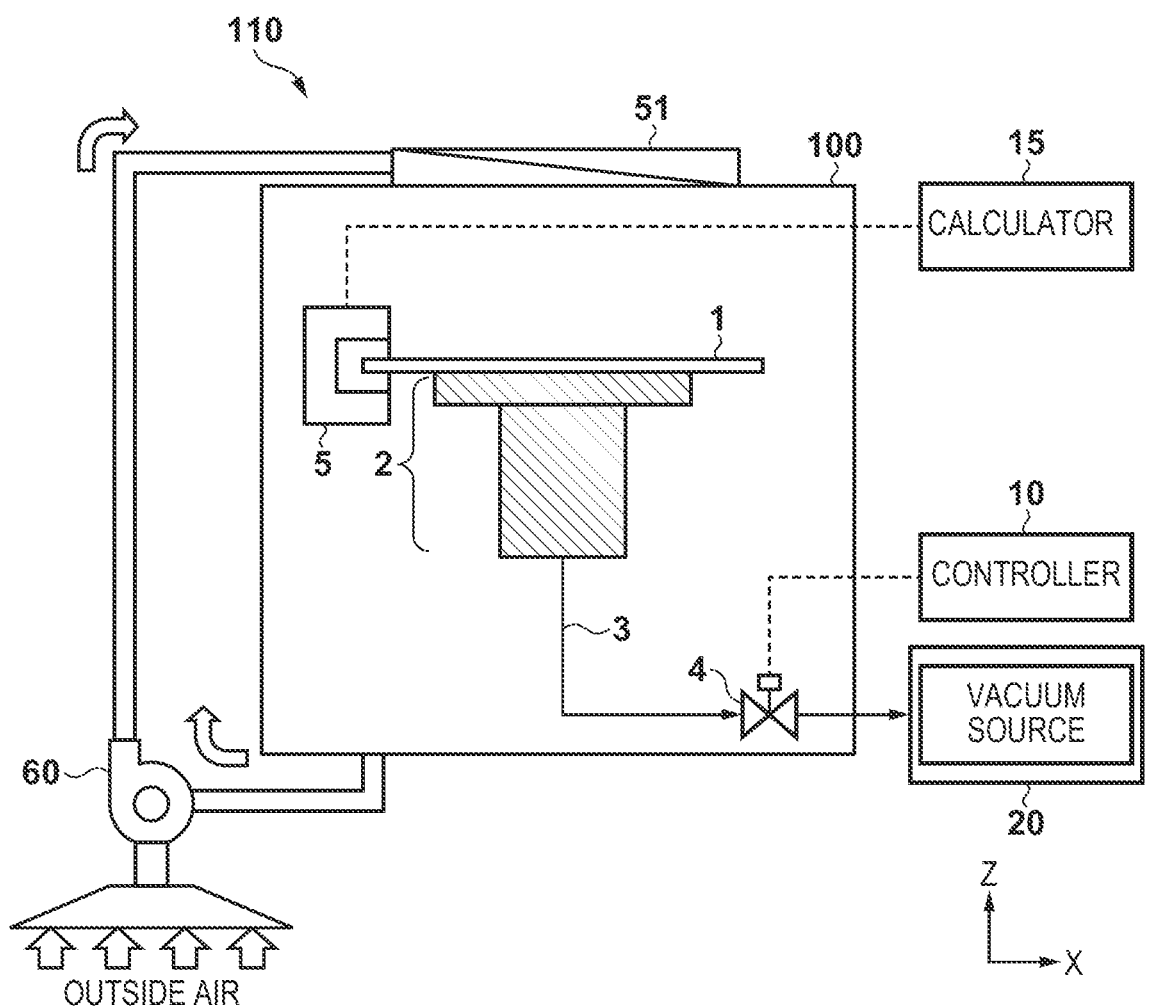
FIG. 1 is a view showing the arrangement of a substrate processing apparatus according to an embodiment.

FIG. 1 is a view showing the arrangement of a substrate processing apparatus 110 that includes a substrate holding apparatus 2 according to this embodiment. The substrate holding apparatus 2 holds and rotates a substrate. The substrate processing apparatus 110 can, for example, perform a process for obtaining the eccentric component of rotation of a substrate by the substrate holding apparatus 2. Such a substrate processing apparatus can be, for example, used in a preprocess and the like of a lithography process.

The substrate processing apparatus 110 accommodates the substrate holding apparatus 2, and includes a chamber 100 which shuts out the outside air. A lithography apparatus and the like to be used in further subsequent processes may be accommodated together in the chamber 100, but their illustrations are omitted herein. The substrate processing apparatus 110 includes a circulation fan 60 for circulating at least part of a gas in the internal space of the chamber 100, and a fan filter unit 51 for filtering the circulated gas and supplying it. With this arrangement, a clean gas is provided into the chamber 100.

The substrate holding apparatus 2 accommodated in the chamber 100 is connected to a vacuum source 20 through a pipe 3, and supports a substrate 1 by vacuum suction using the vacuum source 20. An opening/closing valve 4 provided in the pipe 3 is controlled by a controller 10. The substrate holding apparatus 2 includes a mechanism which rotates the held substrate 1 about the Z-axis which is a direction along a direction perpendicular to a substrate holding surface. The substrate holding apparatus 2 detects the position of the end face portion of the substrate 1 by a position detection apparatus 5, and a calculator 15 calculates the eccentricity and angle of the substrate 1 based on a detection result obtained by the position detection apparatus 5.

Figure 2A:
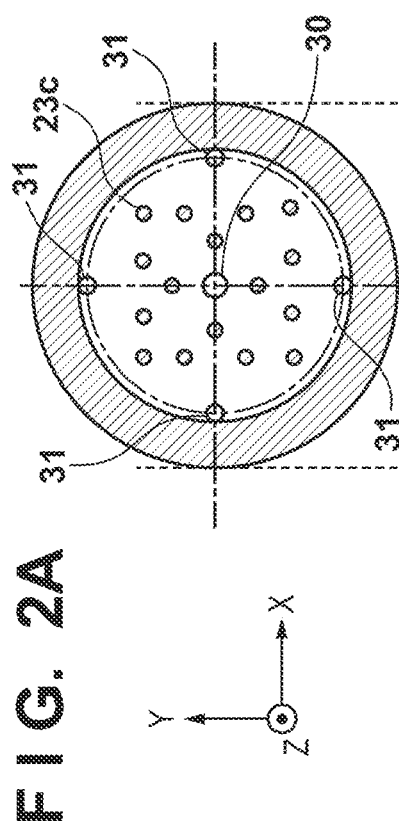
FIGS. 2A and 2B are views showing the arrangement of a substrate holding apparatus.
Figure 2B:
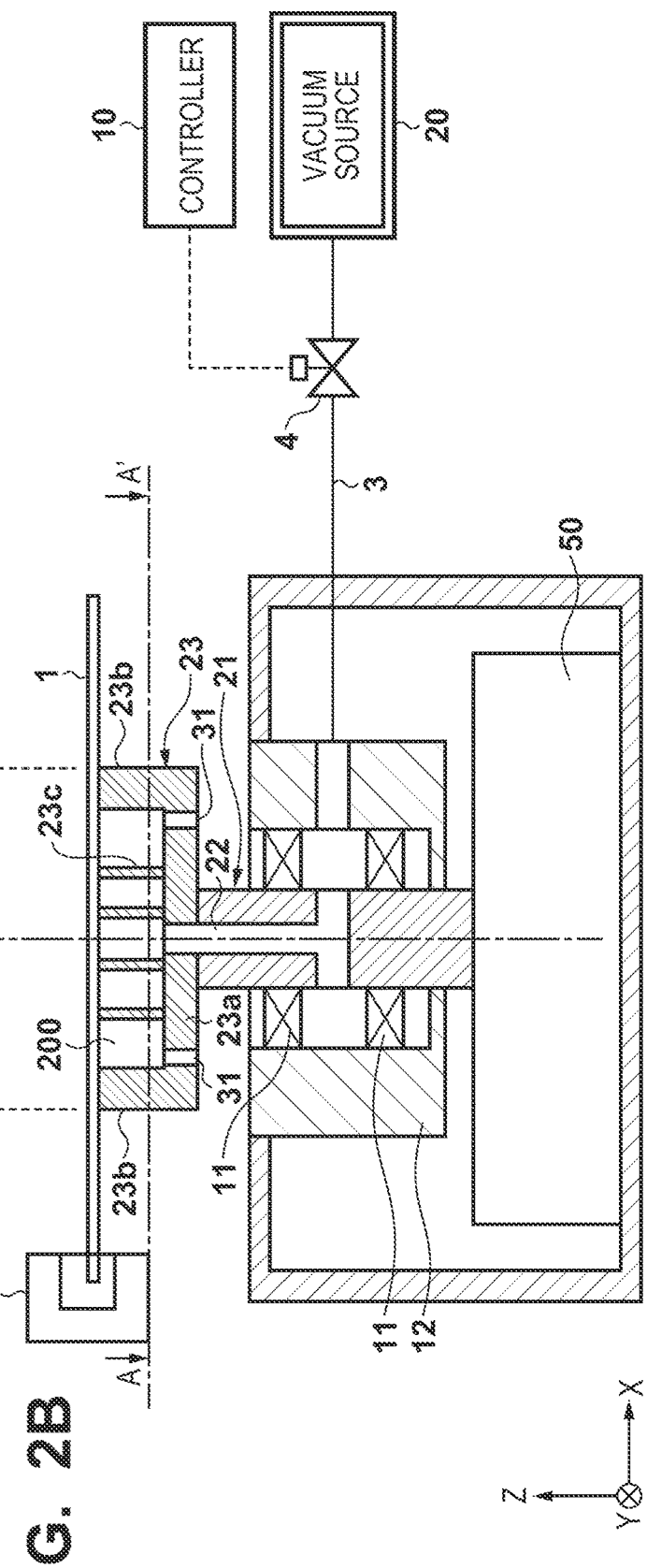

FIGS. 2A and 2B show the arrangement of the substrate holding apparatus 2. FIG. 2B is a side sectional view of the substrate holding apparatus 2, and FIG. 2A is a sectional view taken along a line A-A' in FIG. 2B. The substrate holding apparatus 2 includes a rotary shaft 21 which rotates about a vertical axis (Z-axis). The substrate holding apparatus 2 can perform a process for obtaining the eccentric component of rotation of a substrate by rotating the substrate by the rotary shaft 21. A suction path 22 leading from the upper end of the rotary shaft 21 is formed in the rotary shaft 21.

A holding unit 23 for holding the substrate 1 forms a circle as shown in FIG. 2A, and a suction hole 30 is formed in its rotation center. The holding unit 23 is fixed at the upper end of the rotary shaft 21 such that the suction hole 30 communicates with the suction path 22 of the rotary shaft 21. The holding unit 23 includes, as shown in FIG. 2B, a bottom wall portion 23a in which the suction hole 30 is formed and connected to the upper end of the rotary shaft 21, and an outer peripheral wall portion 23b which arises from the edge of the bottom wall portion 23a and supports a substrate. Therefore, the holding unit 23 forms a cup shape formed from the bottom wall portion 23a and the outer peripheral wall portion 23b, and when the substrate 1 is placed on the holding unit 23, a space 200 is formed.

A plurality of vent holes 31, each of which forms an angle to face the back surface of the substrate 1 placed on the holding unit 23 and vertically extends through the bottom wall portion 23a, are formed in the holding unit 23. They communicate with the clean space outside the substrate holding apparatus 2 (inside the chamber 100). In this embodiment, the plurality of vent holes 31 are arranged at positions rotationally symmetric with respect to the rotation center of the holding unit 23. In the example shown in FIG. 2A, four vent holes 31 are arranged at four rotationally symmetric positions. In addition, in this embodiment, the plurality of vent holes 31 are formed in the vicinity of the edge of the bottom wall portion 23a. The conductance of the plurality of vent holes 31 is preferably, for example, roughly 10% or less of that of the suction hole 30.

In addition, the holding unit 23 includes a plurality of support pins 23c which protrude from the bottom wall portion 23a and support the substrate 1. The contact area between the substrate 1 and the support pins 23c can be small enough to be negligible.

The suction path 22 of the rotary shaft 21 is connected, through the pipe 3 serving as a gas flow path, to the vacuum source 20 which sucks a gas. In this embodiment, an opening/closing valve 4 for opening/closing the pipe between the suction path 22 and the vacuum source 20 is provided in the pipe 3. The opening/closing valve 4 can be opened/closed by an instruction from the controller 10. The lower end of the rotary shaft 21 is connected to a driving mechanism 50 so that the holding unit 23 (that is, the substrate 1) is rotated about the Z-axis. In addition, two upper and lower seal rings 11 are provided between the inner wall of a sleeve 12, which pivotably supports the rotary shaft 21, and the rotary shaft 21 so that evacuation by the vacuum source 20 through the pipe 3 can be performed.

FIG. 4 shows a flowchart of a substrate holding process upon processing a substrate and an example of a pressure change in the space 200. The substrate 1 is loaded into the chamber 100 by a substrate conveyance mechanism (not shown) and placed on the holding unit 23 (S1). When the opening/closing valve 4 is set in an open state by an instruction from the controller 10 so that the pipe 3 and the vacuum source 20 are ventilated, vacuum suction of the substrate 1 is started (S2). Accordingly, the space 200 formed by the substrate 1 and the holding unit 23 becomes nearly vacuum such that the substrate 1 is held. During this, a clean gas inside the chamber 100 is continuously introduced from the plurality of vent holes 31 formed in the holding unit 23.

With this state, the substrate 1 is rotated about the Z-axis by the driving mechanism 50. During this, the position detection apparatus 5 continuously detects the position of the end face portion of the substrate 1, and the calculator 15 calculates the eccentric component of the substrate 1 based on a detection result obtained by the position detection apparatus 5 (S3). Subsequently, in order to release the hold of the substrate 1, the opening/closing valve 4 is set in a closed state by an instruction from the controller 10 so that the ventilation between the vacuum source 20 and the suction path 22 is shut off (S4), and a gas flowing in from the plurality of vent holes 31 breaks the nearly vacuum state of the space 200 (S5). During this, since dust generated by contact between the substrate 1 and the holding unit 23 and dust dropped from the substrate 1 is carried away toward the vacuum source 20 by a gas continuously flowing in from the plurality of vent holes 31, they would never be accumulated in the holding unit 23. In this way, the held state of the substrate 1 by the holding unit 23 is released, and the substrate 1 is conveyed to the next process by the substrate conveyance mechanism (not shown) without contaminating the back side of the substrate 1 (S6).

Figure 3A:
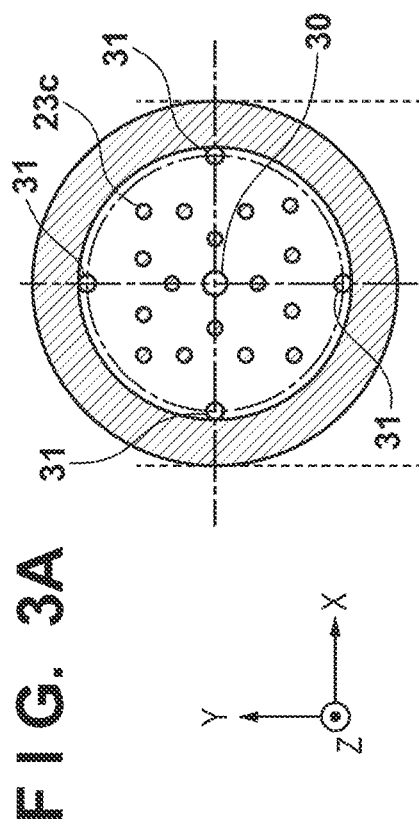
FIGS. 3A and 3B are views showing the arrangement of the substrate holding apparatus according to a modification.
Figure 3B:
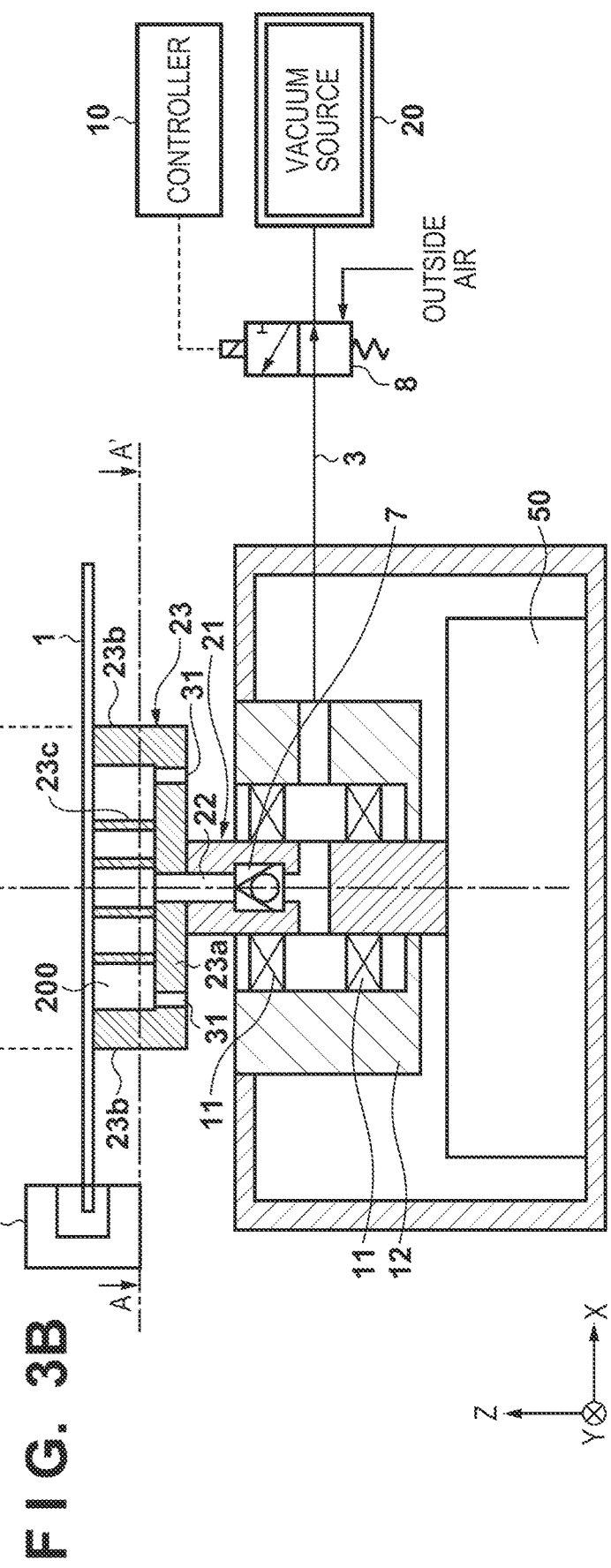

FIGS. 3A and 3B show a modification of the arrangement shown in FIGS. 2A and 2B. In FIG. 2B, the opening/closing valve 4 which is opened/closed by an instruction from the controller 10 is provided in the pipe 3. In FIG. 3B, a directional control valve 8 is provided instead of the opening/closing valve 4. The directional control valve 8 is a control valve configured to be capable of switching between a suction state, in which suction by the vacuum source 20 is performed, and an atmospheric air open state. In addition, a check valve 7 for preventing inflow of a gas into the space 200 is provided in the suction path 22.

FIG. 5 shows a flowchart of a process upon processing a substrate and an example of a pressure change in the space 200 according to this modification. The substrate 1 is loaded into the chamber 100 by the substrate conveyance mechanism (not shown) and placed on the holding unit 23 (S1). When the directional control valve 8 is set in a suction state by an instruction from the controller 10, vacuum suction of the substrate 1 is started (S2). Accordingly, the space 200 formed by the substrate 1 and the holding unit 23 becomes nearly vacuum so that the substrate 1 is held. During this, a clean gas inside the chamber 100 continuously flows in from the plurality of vent holes 31 formed in the holding unit 23.

With this state, the substrate 1 is rotated about the Z-axis by the driving mechanism 50. During this, the position detection apparatus 5 continuously detects the position of the end face portion of the substrate 1, and the calculator 15 calculates the eccentric component of the substrate 1 based on a detection result obtained by the position detection apparatus 5 (S3). During this, since dust generated by contact between the substrate 1 and holding unit 23 and dust dropped from the substrate 1 are carried away toward the vacuum source 20 by a gas continuously flowing in, they would never be accumulated in the holding unit 23. Subsequently, in order to release the hold of the substrate 1, the directional control valve 8 is switched to an atmospheric air open state by an instruction from the controller 10 (S4). At this time, when atmospheric air reaches the check valve 7 from the directional control valve 8 through the pipe 3, the check valve 7 operates. That is, the atmospheric air flowing in from the directional control valve 8 stops at the check valve 7. Accordingly, dust generated at the directional control valve 8 and seal rings 11, mist, and the like would never enter the space 200 while being guided by the atmospheric air from the directional control valve 8 so the substrate 1 would not be contaminated. The nearly vacuum state of the space 200 is broken by a gas flowing in from the plurality of vent holes 31, and the nearly vacuum state of the space from the vacuum source 20 to the check valve 7 is broken by the atmospheric air flowing in through the directional control valve 8. With this arrangement, the nearly vacuum state can be broken in a short time (S5). In this way, the held state of the substrate 1 by the holding unit 23 is released, and the substrate 1 is conveyed to the next process by the substrate conveyance mechanism (not shown) without contaminating the back side of the substrate 1 (S6).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-051520, filed Mar. 19, 2018, which is hereby incorporated by reference herein in its entirety.

What is claimed is:

1. A substrate holding apparatus that holds a substrate, comprising:
   a rotary shaft which rotates about a vertical axis and includes a suction path leading from an upper end of the rotary shaft; and
   a holding unit which includes a suction hole formed in a rotation center, is fixed at the upper end of the rotary shaft such that the suction hole communicates with the suction path, and holds the substrate by sucking the substrate,
   wherein a plurality of vent holes for introducing an external gas into a space between the holding unit and the substrate are formed with an angle to face a back surface of the substrate placed on the holding unit, and
   wherein a size of each of the plurality of vent holes is smaller than a size of the suction hole.

2. The apparatus according to claim 1, wherein the holding unit comprises:
   a bottom wall portion in which the suction hole is formed and connected to the upper end of the rotary shaft;
   an outer peripheral wall portion which arises from an edge of the bottom wall portion and supports the substrate; and
   a plurality of support pins which protrude from the bottom wall portion and support the substrate.

3. The apparatus according to claim 2, wherein the plurality of vent holes are formed in the vicinity of the edge of the bottom wall portion.

4. The apparatus according to claim 1, further comprising an opening/closing valve which opens and closes a gas flow path between the suction path and a vacuum source for sucking a gas,
   wherein the apparatus holds the substrate by setting the opening/closing valve in an open state to suck a gas in the space by the vacuum source and introducing the external gas into the space from the plurality of vent holes, and releases a held state of the substrate by setting the opening/closing valve in a closed state and introducing the external gas into the space from the plurality of vent holes.

5. The apparatus according to claim 1, further comprising:
   a control valve which is provided in a gas flow path between the suction path and a vacuum source for sucking a gas, and is capable of switching between a suction state, in which suction by the vacuum source is performed, and an atmospheric air open state; and
   a check valve which is provided in the suction path and prevents inflow of a gas into the space,
   wherein the apparatus holds the substrate by setting the control valve in the suction state to suck a gas in the space by the vacuum source and introducing the external gas into the space from the plurality of vent holes, and releases a held state of the substrate by setting the control valve in the atmospheric air open state to make a portion from the vacuum source to the check valve open to atmospheric air and introducing the external gas into the space from the plurality of vent holes.

6. The apparatus according to claim 1, wherein a conductance of the plurality of vent holes is not more than 10% of a conductance of the suction hole.

7. The apparatus according to claim 1, wherein the substrate holding apparatus comprises an apparatus which obtains an eccentric component of rotation of the substrate by rotating the substrate by the rotary shaft.

8. A substrate processing apparatus that processes a substrate, comprising a substrate holding apparatus that holds the substrate, wherein the substrate holding apparatus comprises:
   a rotary shaft which rotates about a vertical axis and includes a suction path leading from an upper end of the rotary shaft; and
   a holding unit which includes a suction hole formed in a rotation center, is fixed at the upper end of the rotary shaft such that the suction hole communicates with the suction path, and holds the substrate by sucking the substrate,
   wherein a plurality of vent holes for introducing an external gas into a space between the holding unit and the substrate are formed with an angle to face a back surface of the substrate placed on the holding unit, and
   wherein a size of each of the plurality of vent holes is smaller than a size of the suction hole.

9. The apparatus according to claim 1, wherein the plurality of vent holes are formed at positions rotationally symmetric with respect to the rotation center of the holding unit.

* * * * *